United States Patent [19]

Imura

[11] Patent Number: 5,070,386
[45] Date of Patent: Dec. 3, 1991

[54] PASSIVATION LAYER STRUCTURE WITH THROUGH-HOLES FOR SEMICONDUCTOR DEVICE

[75] Inventor: Yukihiro Imura, Tokyo, Japan

[73] Assignee: Seiko Instruments Inc., Japan

[21] Appl. No.: 559,842

[22] Filed: Jul. 30, 1990

[30] Foreign Application Priority Data

Aug. 9, 1989 [JP] Japan ................................ 1-207223

[51] Int. Cl.⁵ ..................... H01L 29/34; H01L 29/40
[52] U.S. Cl. ........................................ 357/52; 357/53; 357/54
[58] Field of Search .................... 357/52, 53, 54, 23.5, 357/23.15

[56] References Cited

U.S. PATENT DOCUMENTS

| 4,406,053 | 9/1983 | Takasaki et al. | 357/52 |
| 4,870,470 | 9/1989 | Bass, Jr. et al. | 357/45 |

FOREIGN PATENT DOCUMENTS

| 57-208162 | 12/1982 | Japan | 357/52 |
| 59-100559 | 6/1984 | Japan | 357/52 |
| 59-110122 | 6/1984 | Japan | 357/52 |
| 59-219933 | 12/1984 | Japan | 357/52 |

OTHER PUBLICATIONS

"Silicon Processing for the VLSI Era", Wolf, Lattice Press, 1990, pp. 337, 361–362.

Primary Examiner—Rolf Hille
Assistant Examiner—Mahshid Saadat
Attorney, Agent, or Firm—Bruce L. Adams; Van C. Wilks

[57] ABSTRACT

A passivation layer covering a metal wire and semiconductor surface of a semiconductor integrated circuit composed of a metal-oxide-semiconductor (MOS) type transistor is a double-layer comprising a silicon nitride (P-SiN) layer formed by plasma CVD method and a phosphorus silicide glass (PSG) layer beneath the silicon nitride layer, and the P-SiN layer has a vacant region (a window) at the portion more than 20 μm and less than 100 μm away from an edge of a gate oxide layer of the transistor.

9 Claims, 4 Drawing Sheets

PASSIVATION LAYER STRUCTURE WITH THROUGH-HOLES FOR SEMICONDUCTOR DEVICE

BACKGROUND OF THE INVENTION

1. Field of the Invention

The present invention relates to a semiconductor device and especially to a composition of the passivation layer in the semiconductor device.

2. Description of the Related Art

FIG. 5 shows a structural cross sectional view of a semiconductor device using a conventional passivation layer. The metal wire 14 is fabricated after the interlayer dielectric layer 12 is accumulated on the transistor 11. The contact hole 13 is provided at a desired position of the transistor through the interlayer dielectric layer and a gate oxide layer of the transistor. The phosphorus silicate glass (PSG) layer 15 is removed at the pad portion 16 for contacting with the outside after the PSG layer 15 is accumulated. After that the P-SiN layer 17 is removed at the pad portion 16 after the P-SiN layer 17 is accumulated.

As described above, the double-layer composed of the PSG layer and P-SiN layer has been used in many of the semiconductor integrated circuits. Reasons for using the double-layer composed of the PSG layer and P-SiN layer are as follows:

(1) The thick PSG layer (0.5-2 µm) protects the semiconductor surface from contamination by the alkaline metals and damage caused by foreign substance.

(2) The P-SiN layer protects the semiconductor integrated circuit from penetration of moisture.

The P-SiN layer is well-known as the passivation layer for protecting the semiconductor integrated circuit from moisture. However, it has recently been found that the presence of P-SiN accelerates the deterioration of the MOS transistor caused by hot electrons. A distinctive deterioration by the hot electrons results from the blocking P-SiN layer diffusion of hydrogen out of the semiconductor integrated circuit, though the P-SiN layer is good for protecting the transistor from the penetration of moisture.

Hydrogen which is taken into the semiconductor integrated circuit is produced in various processes of the semiconductor integrated circuit manufacturing. In particular, abundant hydrogen is produced when hydrogen annealing is performed or P-SiN is produced in the process of the CVD method using a hydrogen compound. This hydrogen is thought to cause a hot electron trap in the gate oxide layer. Thus, if the P-SiN is used as a passivation material, there remains a problem of preventing the composition of the passivation layer protecting the MOS transistor from preventing the deterioration by the hot electrons.

SUMMARY OF THE INVENTION

In order to solve this problem, the present invention uses a double-passivation layer formed by superposing the P-SiN layer on the PSG layer, and the present invention sets up a vacant region (a through-hole or window) in the P-SiN layer at a portion between 20 µm and 100 µm away from the edge of the gate in the MOS transistor.

Although a P-SiN layer is used as the passivation layer in the present invention, the hydrogen which is taken into the semiconductor integrated circuit can be diffused out by easily passing through the window since the window in the P-SiN layer is positioned adjacent to the transistor.

Accordingly, though P-SiN layer is used as the passivation layer in the present invention, the deterioration of the MOS transistor caused by the hot electrons is reduced because of the presence of the window as compared with the deterioration of a MOS transistor which uses only PSG layer as the passivation layer.

Further, the edge of the window is positioned more than 20 µm away laterally from the edge of the gate oxide layer in the MOS transistor. This is equivalent to the existence of the PSG layer with a thickness of 20 µm between the window and the transistor, and the transistor is sufficiently moisture proof.

DETAILED DESCRIPTION OF THE PREFERRED EMBODIMENT

Figure 1:
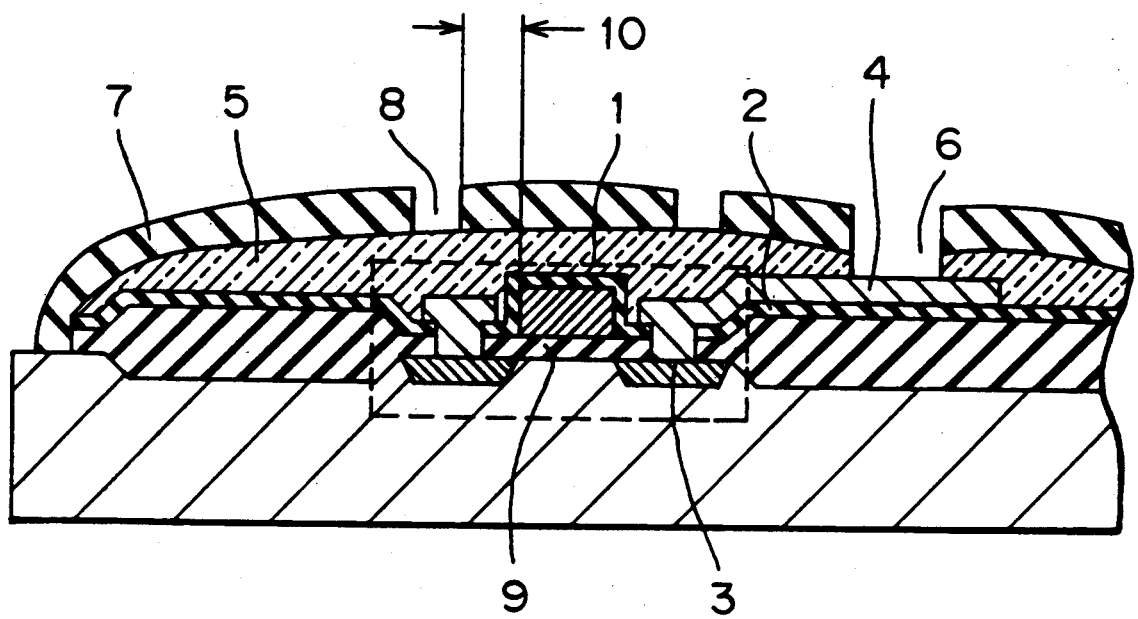
FIG. 1 is a cross sectional view of a structure of a semiconductor device according to a specific embodiment of the present invention.

An embodiment of the present invention will be described with reference to a structural cross sectional view of the semiconductor device shown in the FIG. 1.

The interlayer dielectric layer 2 is superposed on the transistor 1, the contact hole 3 is set up at the desired position in the transistor, and the transistor 1 connects with the metal wire 4. After the PSG layer 5 is accumulated, a portion of the PSG layer is removed at the pad portion 6 where exists the metal wire 4 exists exposed in the contact hole 3 in order to contact the outside.

Further, the process of manufacturing semiconductor device in the FIG. 1 is completed after accumulating the P-SiN layer 7 and removing a portion of the P-SiN layer at the pad portion 6 and the window 8 portion. The distance 10 between the edge of the window 8 and the edge of the gate layer oxide 9 has to be not less than 20 µm and not more than 100 µm.

It is not always necessary to set up the window 8 for all the transistors. It is effective to set up the window 8 concentrated on the peripherals of transistors under the biased conditions on which hot electrons are inclined to be produced and of memory transistors which use channel hot electron injection.

Next, the production method to implement the present invention is described in the processing order based on FIG. 2a-2g.

Figure 2A:
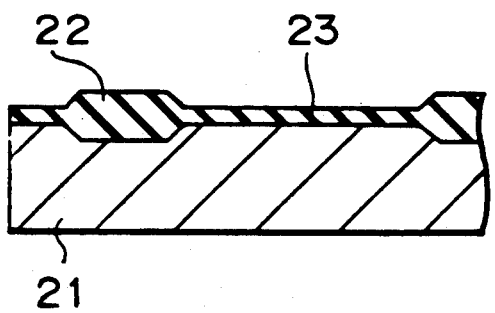
FIG. 2 (a)-(g) are cross sectional views of a structure of a semiconductor resulting from the production process according to the present invention.

FIG. 2a shows the production process which is generally called LOCOS. That is, oxidating the surface of the P type semiconductor substrate 21, forming the field layer oxide 22 for the device isolation and the gate oxide layer 9.

A desired electrical conductivity is acquired by doping an impurity such as phosphorus after accumulating the gate electrode 24. The gate electrode 24 is formed by using photolithography to pattern a layer of polysilicon with photoresist and etching by an etching technique such as, for example, plasma or wet etch. The source region 25 and the drain region 26 are formed by doping an impurity such as phosphorus or arsenic in the surface of the semiconductor substrate 21 generally with ion implantation using the gate electrode 24 as the mask (FIG. 2c.)

The interlayer dielectric layer 2 is formed by accumulating PSG by the CVD method on the whole surface of the field oxide layer 22 and the gate oxide layer 9 and the gate electrode 24.

The contact hole 28 is formed by the removal of a part of the interlayer dielectric layer 2 and gate oxide layer 9 by using photolithography to form a pattern and an etching technique such as, for example, plasma or wet etch. (FIG. 2d.)

Figure 2E:
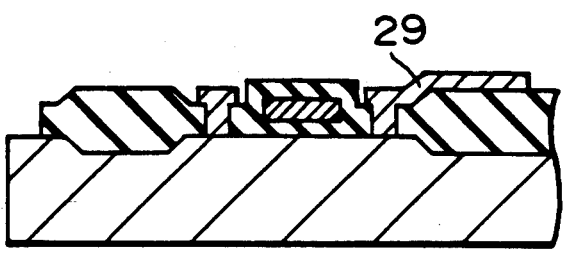
Figure 2B:
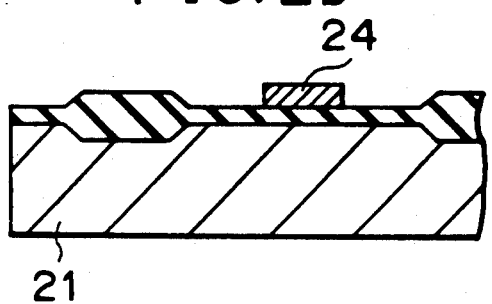

The metal wire 4 is produced by forming a desired pattern with photolithography and etching, as above, after accumulating a metals such as aluminum on the whole surface by vacuum evaporation or sputtering (FIG. 2e.)

Figure 2F:
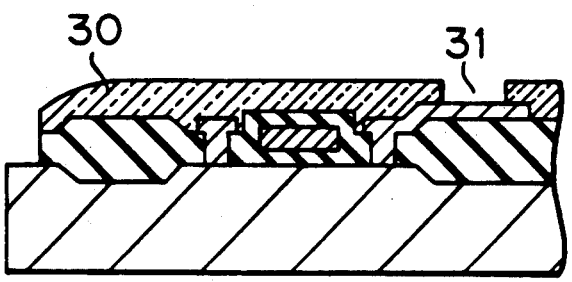
Figure 2C:
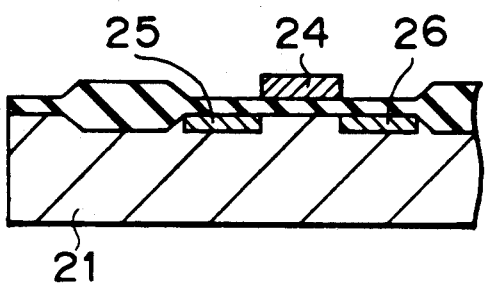

The opening 6 for connecting the metal wire 4 with the external wire maybe formed by etching as above after accumulating PSG to form the first passivation layer 5 (FIG. 2f.)

Figure 2G:
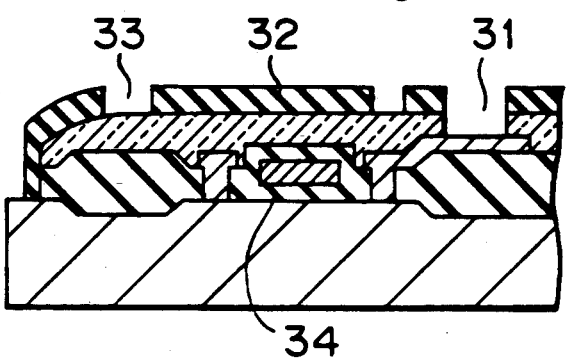
Figure 2D:
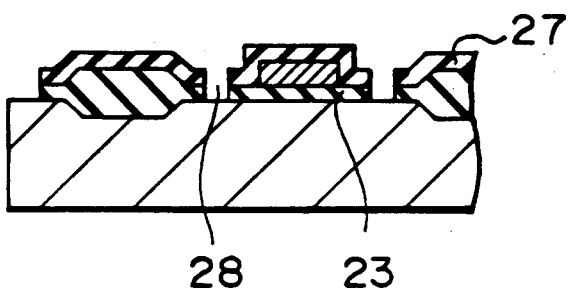

Lastly, the P-SiN which becomes the second protective layer 32 is accumulated by using the plasma CVD method. The opening 6 is also provided through the P-SiN layer. The window 8 for diffusing hydrogen out of the semiconductor device is formed so that the edge of the window 8 is between 20 μm and 100 μm away from the edge of the gate oxide layer region 34. The opening 6 and the window 8 are both formed by etching (FIG. 2g.) The diameter of the window 33 is several μm to tens μm.

Figure 3:
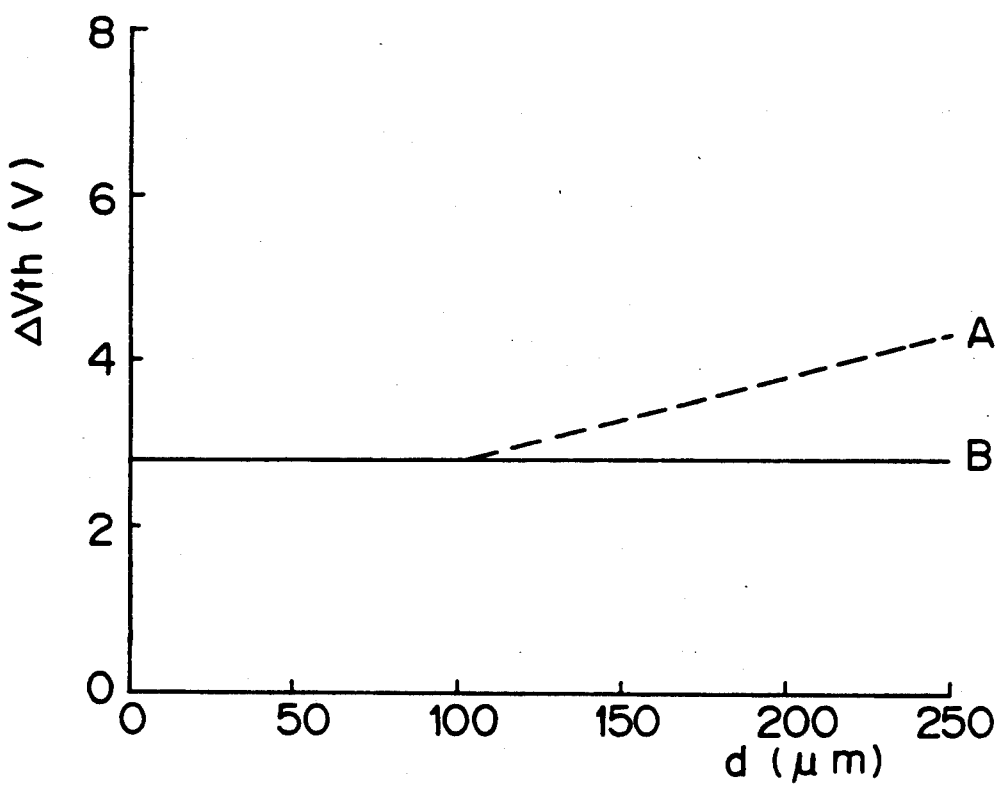
FIG. 3 is a graph demonstrating the relation between the change in the threshold voltage caused by a hot electron and the distance from an edge of the gate oxide layer to an edge of the window.

The present invention enables the contained hydrogen to diffuse effectively out of the integrated circuit and thereby prevents the transistor from deterioration because of an hot electron trap. FIG. 3 shows the practical effect of the window 8 provided for diffusing hydrogen outside. FIG. 3 shows the change of the threshold voltage ΔVth (the threshold voltage after the gate current injection—the threshold voltage before the gate current injection) measured before and after a determined quantity of gate current flows in the MOS transistor by channel hot electron injection as a function of the distance d between the edge of the window 8 and the edge of the gate oxide layer. When the MOS transistor is annealed for several hours at 100°-300° C., it effectively diffuses the hydrogen out.

The dotted line A demonstrates the characteristics of the MOS transistor using the double-passivation layer comprising PSG layer and P-SiN layer which has the window 8. When said distance d is longer than 100 μm, since the hydrogen does not sufficiently scatter toward outside, the change of threshold voltage by hot electrons becomes larger. The line B shows a change of the threshold voltage value when the single-layer PSG is used as the passivation layer for reference. FIG. 3 teaches that if the edge of the window 8 in the P-SiN layer is positioned within about 100 μm from the edge of the gate oxide layer, the window 8 is effective to scatter the hydrogen out sufficiently.

Figure 4:
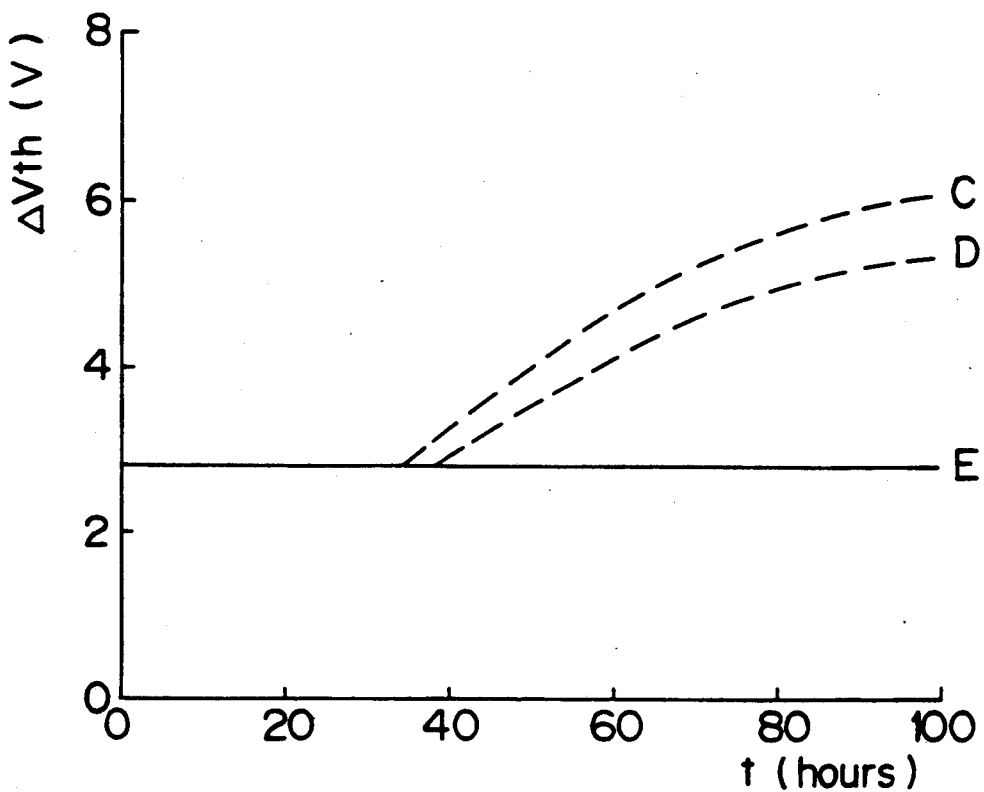
FIG. 4 is the graph demonstrating the relation between a change in the threshold voltage caused by a hot electron and the period of time a semiconductor device is exposed to high temperature and pressure in aqueous vapor atmosphere. The FIG. 5 is the cross sectional view of a structure of a conventional semiconductor device.
Figure 5:
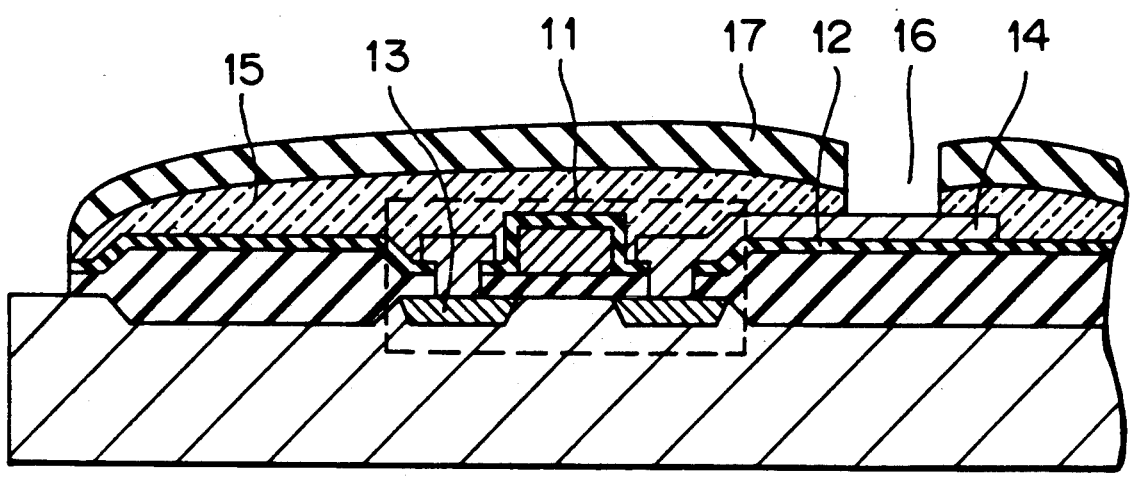

Next, the moisture-proof advantages of a semiconductor device according to the present invention are described below. The FIG. 4 shows the change in the threshold voltage value ΔVth as a function of exposing time t when a fixed quantity of hot electrons are injected into the gate after exposing the MOS transistors of different distance d in a water vapor atmosphere with high temperature and pressure.

The hot electrons deteriorate the transistors greatly when the distance d is 0 μm (dotted line C) or 10 μm (dotted line D), if they are exposed in a water vapor atmosphere with high temperature and pressure for around 40 hours. This happens due to penetration of the moisture through the window.

On the contrary, the transistor has no increase of deterioration and is sufficient wetproof moisture-proof when the distance d is 20 μm through 100 μm (line E.)

As described above, the present invention is advantageous in being capable of scattering the moisture out effectively and providing the sufficient moisture-proofing when the window 8 is provided at the portion 20 μm through 100 μm away from the edge of the gate oxide layer.

What is claimed is:

1. A semiconductor device comprising: a semiconductor substrate; a MOS transistor provided on said semiconductor substrate; and a double passivation layer covering said MOS transistor and said semiconductor substrate and comprising a phosphorus silicon nitride layer and a phosphorus silicate glass layer beneath said silicon nitride layer, said double passivation layer having a window only in said phosphorus silicon nitride layer and not in said phosphoros silicate glass layer, said window being effective to permit the escape of contaminants from the semiconductor device.

2. A semiconductor device as claimed in claim 1, wherein said window is provided at a portion between 20 μm and 100 μm away from an edge of a gate electrode of said MOS transistor.

3. A passivation layer for a MOS transistor comprising: a silicate glass layer and a silicon nitride layer on the silicate layer, wherein said silicon nitride layer has at least one through-hole passing only through said silicon nitrite layer in a region adjacent to the MOS transistor.

4. A passivation layer for a MOS transistor as in claim 3, wherein each said through-hole is between 20 μm and 100 μm away from an edge of a gate electrode of the MOS transistor.

5. A passivation layer for a semiconductor device having electrodes comprising: a first layer comprising of phosphorus silicate glass substantially covering the semiconductor device, a second layer comprising of phosphorus silicon nitride substantially covering said first layer, and means defining at least one through-hole only through said second layer and not through said first layer for permitting the escape of contaminants from the semiconductor device.

6. A passivation layer for a semiconductor device as in claim 5; wherein each said through-hole is between 20 μm and 100 μm away from an edge of an electrode of the semiconductor device.

7. A passivation layer for a semiconductor device as in claim 5; wherein each said through-hole is more than 20 μm away from any edge of any electrode of the semiconductor device.

8. A passivation layer for a semiconductor device as in claim 7; wherein the semiconductor device includes a plurality of transistors, and at least one through-hole is less than 100 μm away from an electrode of at least one of the transistors.

9. A passivation layer for a semiconductor device as in claim 7; wherein each said through-hole is associated with a corresponding electrode of the semiconductor device and is less than 100 μm away from the corresponding electrode.

* * * * *